(12) United States Patent
Caponi et al.

(10) Patent No.: US 6,600,566 B1
(45) Date of Patent: Jul. 29, 2003

(54) HIGH-ORDER HIGH-FREQUENCY ROUGH SURFACE SCATTERING SOLVER

(75) Inventors: Maria Z. Caponi, Manhattan Beach, CA (US); Alain Sei, Pasadena, CA (US); Oscar P. Bruno, Pasadena, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 242 days.

(21) Appl. No.: 09/675,942

(22) Filed: Sep. 29, 2000

(51) Int. Cl.$^7$ .............................................. G01B 11/30
(52) U.S. Cl. .......................................... 356/600; 702/2
(58) Field of Search ................................ 356/600, 446, 356/28.5, 5.04; 702/2

(56) References Cited

PUBLICATIONS

Oscar Bruno, Alain Sei, Maria Caponi; High Order High Frequency Solutions of Rough Surface Scattering Problems.
Oscar Bruno, Alain Sei, Maria Caponi; Rigorous Multi–Scale Solver for Rough Surface Scattering Problems: High–Order–High–Frequency and Variation of Boundaries.
Harald Ansorge; First–order Corrections to Reflection and Transmission at a Curved Dielectric Interface With Emphasis on Polarization Properties; Radio Science, vol. 22, No. 6, pp. 993–998, Nov. 1987.
Harald Ansorge; Electromagnetic Reflection from a Curved Dielectric Interface; IEEE Transactions on Antennas and Propagation, vol. AP–34, No. 6, Jun. 1986, pp. 842–845.
Heinz Chaloupka, Hans–Jurgen Meckelburg; Improved High–Frequency Current Approximation for Curved Conducting Surfaces; AEU, Band 39, 1985, Heft 4, pp. 245–250.
Shung–Wu Lee; Electromagnetic Reflection from a Conducting Surface: Geometrical Optics Solution; IEEE Transactions on Antennas and Propagation, Mar. 197, pp. 185–191.
Soonsung Hong; Asymptotic Theory of Electromagnetic and Acoustic Diffraction by Smooth Convex Surfaces of Variable Curvature; Journal of Mathematical Physics, vol. 8, No. 6, Jun. 1967, pp. 1223–1232.

Primary Examiner—Richard A. Rosenberger
Assistant Examiner—Vincent P. Barth
(74) Attorney, Agent, or Firm—Harness, Dickey & Pierce, P.L.C.

(57) ABSTRACT

The present invention provides a rough surface scattering method and solver for efficiently computing electromagnetic scattered fields resulting from an incident wave (12) being reflected from a surface slowly varying on the scale of the wavelength (10). The wavelength claimed approach to high-frequency scattering is based on the use of expansions of high order in parameter $\lambda$, wavelength of the incident radiation. The resulting high-order expansion approach expands substantially on the range of applicability over low order methods, and can be used in some of the most challenging cases arising in applications. The surface current (14) induced by the incident wave (12) is represented as a high-order high-frequency expansion (20). The surface current ansatz is substituted into the surface current integral equation (22), wherein a surface current series expansion is formed (24) having, a high frequency order. The surface current series expansion includes an oscillatory integral and surface current coefficients. An asymptotic expansion of the oscillatory integral is produced having a Taylor series (26). The Taylor series is evaluated and the surface current coefficients (32) determined. The surface current coefficients are inserted into the surface current series expansion. The surface current series expansion is evaluated to yield the surface current (36). Finally, the scattered field is computed based upon the solved surface current (36).

19 Claims, 3 Drawing Sheets

HIGH-ORDER HIGH-FREQUENCY ROUGH SURFACE SCATTERING SOLVER

This invention was made with Government support under F49620-99-C-0014 awarded by AFOSR/DARPA. The Government has certain rights in this invention.

BACKGROUND OF THE INVENTION

1. Field of the Invention

The present invention relates generally to scattering processes, and in particular to computation of electromagnetic scattered fields from multiple scale geometries.

2. Discussion of the Related Art

Electromagnetic scattering from rough surfaces such as the surface of the ocean plays an important role in a wide range of applications including imaging, remote sensing, and detection. The analysis of the scattering processes involved in these applications poses a rather challenging scientific problem that requires description and understanding of diffraction by complicated surfaces. Computationally, the main difficulty arises from the multiple-scale nature of the scattering surfaces, whose spectrum spans a wide range of lengthscales. A number of techniques have been developed to treat associated limiting cases. For example, the high frequency case, in which the wavelength, $\lambda$, of the incident radiation is much smaller than the surface lengthscales can be handled by asymptotic methods such as geometrical optics or physical optics approximations. On the other hand, resonant problems where the incident radiation is of the order of the surface scale are treated by perturbation methods, typically first or second or expansions in the height, h, of the surface.

However, when a multitude of scales is present on the surface, none of the techniques described above either alone or in combination in so-called two-scale approaches is adequate. The two-scale models imply a splitting of the surface into a large scale and a small scale. Typically, a first order approximation in wavelength is used to treat the smooth components of the surface, and a first order in surface height is used to deal with the rough components of the surface. The results provided by these methods are not satisfactory precisely as a result of limitations imposed by the low orders of approximation used in both, the high-frequency approximation method and the small perturbation method.

SUMMARY OF THE INVENTION

The present invention provides a rough surface scattering method and solver for efficiently computing electromagnetic scattered fields resulting from an incident wave being reflected from a slowly varying surface (high frequency case). The claimed approach to multi-scale scattering is based on the use of expansions of high order in parameter $\lambda$. The resulting high-order perturbation expansion approach expands substantially on the range of applicability over low order methods, and can be used in some of the most challenging cases arising in applications; A surface current is induced by the incident wave. The surface current is determined by solving a surface current integral equation. A surface current ansatz is substituted into the surface current integral equation, wherein a surface current series expansion is formed having a high frequency order. The surface current series expansion includes an oscillatory factor and surface current coefficients to be determined. An asymptotic expansion of the oscillatory integral is produced such that a Taylor series including a non-convergent integral is formed. The non-convergent integral is re-interpreted by means of analytic continuation. The re-interpreted non-convergent integral is inserted into the Taylor series to solve for the surface current coefficients. The surface current coefficients are inserted into the surface current series expansion and the surface current is obtained by summing the power series in $\lambda$ with the known surface current coefficients. Finally, the scattered field is computed based upon the solved surface current, by quadratures.

For a more complete understanding of the invention, its objects and advantages, reference may be had to the following specification and to the accompanying drawings.

DETAILED DESCRIPTION OF THE PREFERRED EMBODIMENT

Figure 1:
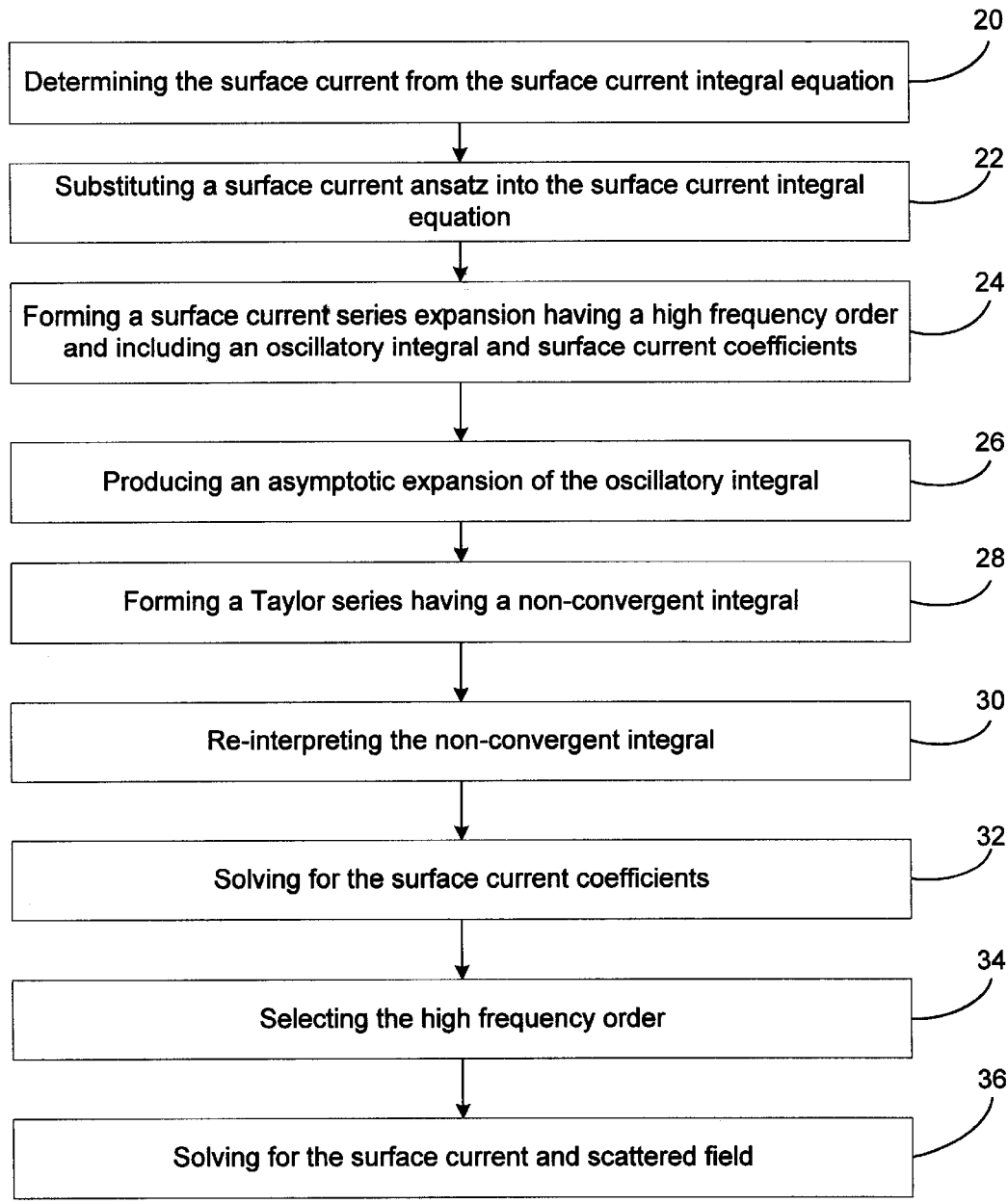
FIG. 1 illustrates a flow diagram of a method for computing scattered fields in accordance with the teachings of the invention.

Referring to FIG. 1, a method of computing a scattered field according to the present invention is shown. The method is based on the use of expansions of high order in the parameter $\lambda$. Such extensions require rather complex mathematical treatments, including complex variable theory and analytic continuation. The resulting approach expands substantially on the range of applicability over low order methods, and can be used in some of the most challenging cases arising in applications. Here, we focus on a high-order perturbation expansion in the wavelength $\lambda$.

1. Introduction

Figure 2:
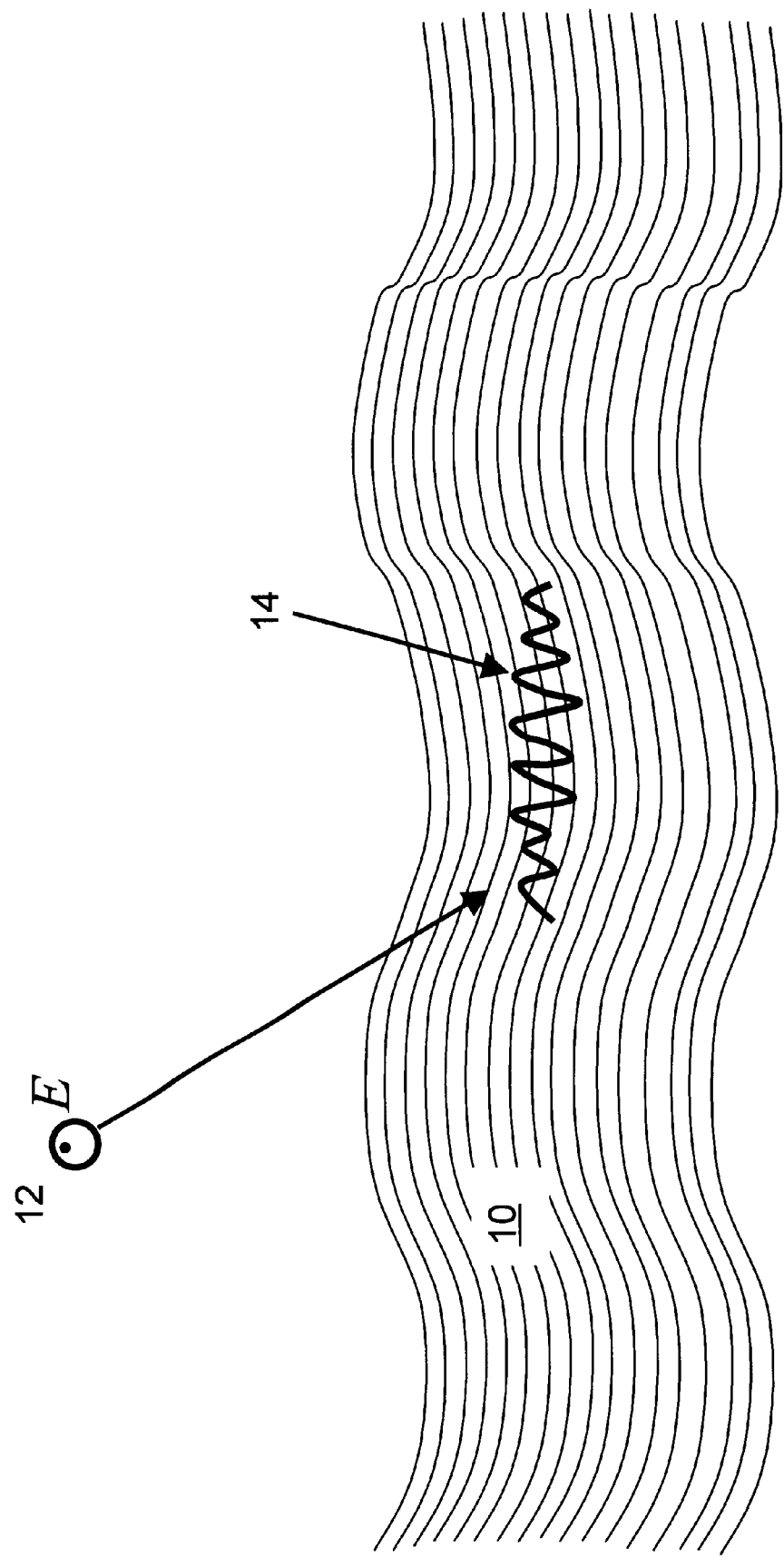
FIG. 2 illustrates a transverse electric polarized wave (TE) impinging on a rough surface.

With additional reference to FIG. 2, a transverse electric polarized wave (TE) 12, with electric field, E, pointing out of the figure, impinging on a rough surface 10 is illustrated. The method is particularly suitable for two-dimensional problems of scattering from a perfectly conducting rough surface 10 of a transverse electric polarized wave (TE) 12. A scattered field created by the incident plane wave 12 impinging on the rough surface 10 solves Helmholtz's equation with a Dirichlet boundary condition. The scattered field can be computed from the surface current density, v, 14 induced on the rough surface f(x) 10 by the incident plane wave 12 by integrating the solved surface current against the Green's function. See, Wave scattering from rough surfaces, by A. G. Voronovich, Springer-Verlag, Berlin, 1994, which is hereby incorporated by reference. The function v solves the integral equation:

$$\frac{v(x,k)}{2} - \frac{i}{4}\int_{-\infty}^{+\infty} h(kMM')g(x,x')v(x',k)dx' = -e^{i\alpha x - i\beta f(x)}, \quad (1)$$

step 20, where $MM' = \sqrt{(x'-x)^2 + (f(x')-f(x))^2}$   $h(t) = tH_1^{\ 1}(t)$  $H_1^{\ 1}$ Hankel function $$g(x, x') = \frac{f(x') - f(x) - (x' - x)f'(x')}{MM'^2} \quad \alpha = k\sin(\theta_{inc}) \quad \beta = k\cos(\theta_{inc}).$$

To solve this equation, an asymptotic expansion of high order around $k=\infty$ is used. The asymptotic expansion results from the ansatz $$v(x, k) = e^{i\alpha x - i\beta f(x)} \sum_{n=0}^{+\infty} \frac{v_n(x)}{k^n}, \quad (2)$$

step 22.

From equations (1) and (2) we obtain the following equation for the surface current coefficients;

$$\sum_{n=0}^{+\infty} \frac{1}{k^n}\left(v_n(x) - \frac{i}{2}I^n(x, k)\right) = -2, \text{ step 24.} \quad (3)$$

where $$I^n(x, k) = \int_{-\infty}^{+\infty} h(kMM')g(x, x')e^{i\alpha(x'-x)-i\beta(f(x')-f(x))}v_n(x')dx'.$$

To obtain the coefficients $v_n(x)$ we produce the asymptotic expansion of $I^n(x,k)$, an oscillatory integral, in powers of $1/k$, step 26. To do this we use two separate integration regions which we define below. However using a single integration region or multiple integration regions is within the scope of the invention.

$$I^n_-(x, k) = \int_{-\infty}^{x} h(kMM')g(x, x')e^{i\alpha(x'-x)-i\beta(f(x')-f(x))}v_n(x')dx'$$

$$I^n_+(x, k) = \int_{x}^{+\infty} h(kMM')g(x, x')e^{i\alpha(x'-x)-i\beta(f(x')-f(x))}v_n(x')dx'$$

2. Asymptotic Expansion of $I_+^n(x,k)$

We focus on an asymptotic expansion for $I_+^n(x,k)$. Using $t=x'-x$ we can write $$I_+^n(x, k) = \int_0^{+\infty} h(k\phi + (x, t))g(x, x+t)e^{i\alpha t - i\beta(f(x+t)-f(x))}v_n(x+t)dt \quad (4)$$

where $$\phi+(x,t) = \sqrt{t^2 + (f(x+t)-f(x))^2}.$$

For the simplest treatment we present here we assume that $f(x)$ satisfies the condition $$\phi'+(x, t) = \frac{\partial \phi + (x, t)}{\partial t} > 0 \quad \text{for } t \geq 0$$

so that the map $t|\to\phi+(x,t)$ is invertible; this condition is generally satisfied by rough surfaces considered in practice. Then setting $$u = \phi+(x,t) \Leftrightarrow t = \phi_+^{-1}(x,u)$$

we can rewrite equation (4) in the form $$I_+^n(x, k) = \int_0^{+\infty} h(ku)\frac{g(x, x+\phi_+^{-1}(x, u))}{\phi'+(x, \phi_+^{-1}(x, u))}v_n(x+\phi_+^{-1}(x, u))e^{i\alpha\phi_+^{-1}(x,u)-i\beta(f(x+\phi_+^{-1}(x,u))-f(x))}du$$

or, calling $$F_n^+(x, u) = \frac{g(x, x+\phi_+^{-1}(x, u))}{\phi'+(x, \phi_+^{-1}(x, u))}v_n(x, \phi_+^{-1}(x, u)) \quad (5)$$

$$\psi+(x,u) = (f(x+\phi_+^{-1}(x,u))-f(x))\cos(\theta_{inc})-\phi_+^{-1}(x,u)\sin(\theta_{inc}),$$

$$I_+^n(x, k) = \int_0^{+\infty} h(ku)F_n^+(x, u)e^{-ik\psi+(x,u)}du.$$

We can now use the Taylor series of the map $u|\to F_n^+(x,u)$ around $u=0$ $$F_n^+(x, u) = \sum_{m=0}^{+\infty} \frac{\partial^m F_n^+(x, 0)}{\partial u^m}\frac{u^m}{m!} = \sum_{m+0}^{+\infty} p_{n,m}^+(x)u^m$$

$$p_{n,m}^+(x) = \frac{1}{m!}\frac{\partial^m F_n^+(x, 0)}{\partial u^m}$$

to express $I_+^n(x,k)$ in the form $$I_+^n(x, k) = \sum_{m=0}^{+\infty} p_{n,m}^+(x)\int_0^{+\infty} u^m h(ku)e^{-ik\psi+(x,u)}du \quad (6)$$

$$I_+^n(x, k) = \sum_{m=0}^{+\infty} \frac{p_{n,m}^+(x)}{k^{m+1}}\int_0^{+\infty} v^m h(v)e^{-ik\psi+\left(x,\frac{v}{k}\right)}dv = \sum_{m=0}^{+\infty} \frac{p_{n,m}^+(x)}{k^{m+1}}A+(k, m, x),$$

step 28 where we have set $$A^+(k, m, x) = \int_0^{+\infty} v^m h(v)e^{-ik\psi^+\left(x,\frac{v}{k}\right)}dv \quad (7)$$

These non-convergent integrals are re-interpreted by means of analytic continuation—in a manner similar to that used in the definition and manipulation of Mellin transforms. See *Asymptotic expansions of integrals* (hereby incorporated by reference), by N. Bleistein and R. A. Handelsman, Dover Publications, New York, 1986, for a complete treatment of this analytic continuation procedure in the case of the Mellin transform, step 30.

To complete our expansion of $I_+^n(x,k)$ we produce a corresponding expansion of the quantity $A^+(k,m,x)$ in powers of 1/k. With $\epsilon=1/k$ we call $$\tilde{A}^+(\varepsilon, m, x) = A^+(k, m, x) = \int_0^{+\infty} v^m h(v) e^{-i\psi^+(x,\varepsilon v)/\varepsilon} dv. \quad (8)$$

By evaluation of the successive derivatives of $\tilde{A}^+(\epsilon,m,x)$ with respect to $\epsilon$ at $\epsilon=0$ it is easy to check that the coefficients of the Taylor series of $\tilde{A}^+(\epsilon,m,x)$ with respect to $\epsilon$ can be obtained directly if the integrals in the sequence $$\tilde{A}^+(0, m, x) = \int_0^{+\infty} v^m h(v) e^{-i\frac{\partial \psi^+}{\partial u}(x,0)} dv,$$

are known. For example, the first two such derivatives are given by $$\left(\text{with } \psi_n^+(x) = \frac{\partial^n \psi^+}{\partial u^n}(x, u=0)\right)$$

$$\left.\frac{\partial \tilde{A}^+(\varepsilon, m, x)}{\partial \varepsilon}\right|_{\varepsilon=0} = -i\frac{\psi_2^+(x)}{2} \tilde{A}^+(0, m+2, x)$$

$$\left.\frac{\partial^2 \tilde{A}^+(\varepsilon, m, x)}{\partial \varepsilon^2}\right|_{\varepsilon=0} = -i\frac{\psi_3^+(x)}{3} \tilde{A}^+(0, m+3, x) - \frac{(\psi_2^+)^2(x)}{4} \tilde{A}^+(0, m+4, x).$$

Using equations (6) and (8) the expansion for $I_+^n(x,k)$ results. The expansion of $I_-^n(x,k)$ is obtained through a similar derivation. The combined expansion for $I^n(x,k)$ involves the combinations of quantities such as $p_{n,m}^+(x)$, $\psi_I^+(x)$, $p_{n,m}^-(x)$, $\psi_L^-(x)$, $\tilde{A}^+(0,m,x)$, $\tilde{A}^-(0,m,x)$. It can be shown that the integrals $\tilde{A}^\pm(0,m,x)$ for all m—can be obtained from the integrals $$\int_0^{+\infty} v^{m+1} H_1^1(v) \cos(av) dv$$

if m even $$\int_0^{+\infty} v^{m+1} H_1^1(v) \sin(av) dv$$

if m odd
for which closed form formulas are available in *Handbook of mathematical functions with formulas, graphs, and mathematical tables*, by M. Abramowitz and I. Stegun, U.S. Dept Next, the high frequency order for the computation is selected, step 34. The scope of the invention includes a high frequency order that is 2 or greater. Those skilled in the art will readily recognize that selection of the high frequency order involves a trade-off between computation speed and accuracy which will vary depending on the particular application.

Finally, having determined the surface current coefficients, the surface current is computed with formula (2) for, and the scattered field is computed by integrating the solved surface current against Green's function, step 36.

3. Numerical Results

To test the accuracy of the procedure we compared our results to a highly accurate boundary variation code in a region (in wavelength) where the two algorithms were very accurate as shown below. See, Numerical solution of diffraction problems: a method of variation of boundaries I, II, III, by O. Bruno and F. Reitich, J. Opt. Soc. A 10, 1168–1175, 2307–2316, 2551–2562, 1993. Note that these two methods are substantially different in nature: ours is a high order that these two methods are substantially different in nature: ours is a high order expansion in $\lambda$ whereas the other is a high order expansion in the height h of the profile.

All our results are for normal incidence illumination. The results listed in the columns Order 0–17 are the relative errors for each scattered energy (efficiency) listed.

We start with the simplest example namely a sinusoidal profile $$f(x) = \frac{h}{2}\cos(2\pi x).$$

Figure 3A:
FIGS. 3A, 3B and 3C are examples of graphical profiles corresponding, respectively, to three examples of numerical results obtained in accordance with the invention.

In this example we have h=0.025 and $\lambda$=0.025. The profile is illustrated in FIG. 3A.

| Scattering Direction # | Scattered Energy | Order 0 | Order 1 | Order 3 | Order 5 | Order 9 | Order 11 |
|---|---|---|---|---|---|---|---|
| 0 | 4.843033211037387e-02 | 1.9e-3 | 4.8e-6 | 1.9e-8 | 4.2e-11 | 1.6e-15 | 0.0e-16 |
| 1 | 4.533269321280629e-02 | 2.3e-3 | 2.4e-6 | 8.3e-9 | 2.4e-11 | 1.8e-15 | 0.0e-16 |
| 2 | 8.263582066556663e-02 | 8.3e-4 | 3.0e-6 | 1.3e-8 | 3.5e-11 | 3.4e-16 | 0.0e-16 |
| 3 | 1.032017750281185e-03 | 1.8e-2 | 7.4e-5 | 3.7e-8 | 1.3e-10 | 9.7e-15 | 1.0e-15 |
| 4 | 1.019744820363490e-01 | 1.0e-3 | 1.3e-6 | 7.1e-10 | 1.6e-12 | 0.0e-16 | 0.0e-16 |
| 5 | 1.396970992023250e-01 | 1.2e-4 | 3.4e-6 | 5.1e-9 | 8.7e-12 | 0.0e-16 | 0.0e-16 |
| 6 | 7.578492663719054e-02 | 7.9e-4 | 6.5e-6 | 1.3e-8 | 2.6e-11 | 3.7e-16 | 0.0e-16 |
| 7 | 2.361867030378681e-02 | 1.3e-3 | 1.0e-5 | 2.3e-8 | 5.5e-11 | 8.8e-16 | 0.0e-16 |

Commerce, June, 1964, which is hereby incorporated by reference, step 32.

Our next example is given by the profile $$f(x) = \frac{h}{2}(\cos(2\pi x) + \cos(4\pi x)).$$

Figure 3B:

In this example we have h=0.01 and λ=0.025. The profile is illustrated in FIG. 3B.

| Scattering Direction # | Scattered Energy | Order 0 | Order 1 | Order 5 | Order 9 | Order 11 | Order 15 |
|---|---|---|---|---|---|---|---|
| 0 | 1.983702874853860e-01 | 1.4e-3 | 6.7e-6 | 6.3e-10 | 1.8e-13 | 5.0e-15 | 0.0e-16 |
| 1 | 2.125625186015414e-02 | 4.3e-3 | 7.3e-6 | 8.6e-10 | 4.6e-14 | 4.9e-16 | 0.0e-16 |
| 2 | 5.109656298137152e-02 | 4.2e-3 | 5.3e-5 | 1.3e-9 | 3.5e-14 | 6.9e-15 | 0.0e-16 |
| 3 | 1.350594564861170e-01 | 1.1e-3 | 3.0e-6 | 1.8e-10 | 5.1e-14 | 6.9e-16 | 0.0e-16 |
| 4 | 1.670755436364386e-02 | 4.3e-3 | 928e-6 | 1.5e-9 | 1.8e-13 | 0.0e-14 | 0.0e-16 |
| 5 | 1.041839113172000e-01 | 8.7e-4 | 1.1e-5 | 4.7e-10 | 3.8e-14 | 0.0e-16 | 0.0e-16 |
| 6 | 3.029977474761340e-02 | 7.6e-4 | 1.1e-5 | 4.8e-10 | 1.0e-15 | 2.0e-15 | 0.0e-16 |
| 7 | 2.828409217693459e-02 | 2.5e-3 | 3.2e-5 | 1.8e-9 | 3.5e-14 | 4.6e-15 | 6.1e-16 |

Our last example is a third order "Stokes" wave (cf. [9]) given by $$f(x) = \frac{h}{2}(-\cos(2\pi x) + 0.35\cos(4\pi x) - 0.035\cos(6\pi x)).$$

Figure 3C:

Here h=0.03 and λ=0.025. The profile is illustrated in FIG. 3C.

| Scattering Direction # | Scattered Energy | Order 0 | Order 1 | Order 5 | Order 9 | Order 13 | Order 17 |
|---|---|---|---|---|---|---|---|
| 0 | 1.168946586556380e-01 | 1.1e-3 | 2.1e-6 | 1.0e-9 | 1.8e-12 | 8.5e-15 | 0.0e-16 |
| 1 | 1.259788401686170e-01 | 1.1e-3 | 1.0e-5 | 9.0e-10 | 5.8e-13 | 7.9e-15 | 0.0e-16 |
| 2 | 7.407393363864252e-03 | 3.2e-3 | 2.7e-5 | 3.6e-9 | 1.9e-12 | 9.6e-15 | 0.0e-16 |
| 3 | 2.657137880809774e-02 | 5.1e-3 | 1.8e-5 | 1.3e-9 | 4.1e-13 | 1.4e-14 | 1.0e-15 |
| 4 | 4.889524445075034e-02 | 2.5e-5 | 1.7e-5 | 1.9e-9 | 2.4e-13 | 9.9e-16 | 2.8e-16 |
| 5 | 1.497662001023263e-02 | 4.7e-3 | 2.7e-5 | 3.6e-9 | 1.4e-12 | 1.3e-14 | 0.0e-16 |
| 6 | 1.617786430146189e-03 | 1.4e-2 | 5.9e-6 | 2.0e-9 | 9.0e-13 | 2.8e-14 | 1.9e-15 |
| 7 | 2.523077976253081e-02 | 5.4e-3 | 6.9e-6 | 6.7e-10 | 1.1e-12 | 2.8e-14 | 0.0e-16 |

Our implementation of this method is very efficient. All the functions considered are decomposed in their Fourier series. The largest run time is 22 sec for the order 17 calculation presented in the table above on a DEC Alpha workstation (600 MHz). A more typical run for the order 11 calculation presented in the second example took 3 seconds.

Thus it will be appreciated from the above that as a result of the present invention, a method for computing a scattered field resulting from an incident wave being reflected from a rough surface is provided by which the principal objectives, among others, are completely fulfilled. It will be equally apparent and is contemplated that modification and/or changes may be made in the illustrated embodiment without departure from the invention. Accordingly, it is expressly intended that the foregoing description and accompanying drawings are illustrative of preferred embodiments only, not limiting, and that the true spirit and scope of the present invention will be determined by reference to the appended claims and their legal equivalent.

What is claimed is:

1. A method of computing a scattered field resulting from an incident wave being reflected from a rough surface, a surface current being induced by the incident wave, comprising the steps of:

representing the surface current as high-order high-frequency expansion;

substituting a surface current ansatz into the surface current integral equation, wherein a surface current series expansion is formed having a high frequency order, the surface current series expansion including an oscillatory integral and surface current coefficients;

producing an asymptotic expansion of the oscillatory integral;

evaluating the asymptotic expansion for the surface current coefficients;

inserting the surface current coefficients into the surface current series expansion;

evaluating the surface current series expansion for the surface current; and computing the scattered field based upon the solved surface current.

2. The method of claim 1 wherein the step of producing an asymptotic expansion includes the steps of:

forming a Taylor series that includes a non-convergent integral;

re-interpreting the non-convergent integral by means of analytic continuation; and inserting the re-interpreted non-convergent integrals into the Taylor series to solve for the surface current coefficients.

3. The method of claim 2 wherein the step of producing an asymptotic expansion further includes the step of dividing the oscillatory integral into split integrals covering separate integration regions.

4. The method of claim 1 wherein the selected high frequency order is preferably 20.

5. The method of claim 2 further comprising the step of solving the re-interpreted nonconvergent integral using a closed form formula.

6. The method of claim 2 further comprising the step of solving the re-interpret non-convergent integral using numerical analysis.

7. The method of claim 1 wherein the step of computing the scattered field includes integrating the solved surface current against Green's function.

8. The method of claim 1 wherein the oscillatory integral is $$I^n(x,k) = \int_{-\infty}^{+\infty} h(kMM')g(x,x')e^{i\alpha(x'-x)-i\beta(f(x')-f(x))}v_n(x')dx',$$

where; $MM' = \sqrt{(x'-x)^2 + (f(x')-f(x))^2} h(t) = tH_1^1(t)$ $H_1^1$ Hankel function $$g(x,x') = \frac{f(x')-f(x)-(x'-x)f'(x')}{MM'^2}$$

$\alpha = k\sin(\theta_{inc})$ $\beta = k\cos(\theta_{inc})$.

9. The method of claim 2 wherein the Taylor series is $$I^n_+(x,k) = \sum_{m=0}^{+\infty} \frac{p^+_{n,m}(x)}{k^{m+1}} A + (k,m,x).$$

10. A method of computing a scattered field resulting from an incident wave being reflected from a rough surface having a characteristic lengthscale, a surface current being induced by the incident wave, the incident wave having a wavelength less than the rough surface lengthscale, comprising the steps of:

representing the surface current as a high-order high-frequency expansion;

substituting a surface current ansatz into the surface current integral equation, wherein a surface current series expansion is formed having a high frequency order, the surface current series expansion including an oscillatory integral and surface current coefficients;

producing an asymptotic expansion of the oscillatory integral such that a Taylor series including a non-convergent integral is formed;

re-interpreting the non-convergent integral by means of analytic continuation;

inserting the re-interpreted non-convergent integrals into the Taylor series to solve for the surface current coefficients;

inserting the surface current coefficients into the surface current series expansion;

evaluating the surface current series expansion for the surface current; and integrating the solved surface current against Green's function, whereby the scattered field is determined.

11. The method of claim 10 wherein the step of producing an asymptotic expansion further includes the step of dividing the oscillatory integral into split integrals covering separate integration regions.

12. The method of claim 10 wherein the high frequency order is at least about three.

13. The method of claim 10 further comprising the step of solving the re-interpreted non-convergent integral using a closed form formula.

14. The method of claim 10 wherein the Taylor series is $$I^n_+(x,k) = \sum_{m=0}^{+\infty} \frac{p^+_{n,m}(x)}{k^{m+1}} A + (k,m,x).$$

15. The method of claim 10 further comprising the step of solving the re-interpreted non-convergent integral using a closed form formula.

16. The method of claim 15 wherein the closed form formula is $$\int_0^{+\infty} v^{m+1} H_1^1(v) \sin(av) dv$$

if m even
and $$\int_0^{+\infty} v^{m+1} H_1^1(v) \sin(av) dv$$

if m odd.

17. A solver for computing a scattered field resulting from an incident wave being, reflected from a rough surface having a characteristic lengthscale, a surface current being induced by the incident wave, the incident wave having a wavelength less than the rough surface lengthscale, comprising:

means for representing the surface current as a high-order high-frequency expansion;

means for substituting a surface current ansatz into the surface current integral equation, wherein a surface current series expansion is formed having a high frequency order, the surface current series expansion including an oscillatory integral and surface current coefficients;

means for producing an asymptotic expansion of the oscillatory integral such that a Taylor series including a non-convergent integral is formed;

means for re-interpreting the non-convergent integral by means of analytic continuation;

means for inserting the re-interpreted non-convergent integrals into the Taylor series to solve for the surface current coefficients;

means for inserting the surface current coefficients into the surface current series expansion;

means for evaluating the surface current series expansion for the surface current; and means for integrating the solved surface current against Green's function, whereby the scattered field is determined.

18. The solver of claim 17 wherein the high frequency order is at least about three.

19. The solver of claim 17 further comprising means for dividing the oscillatory integral into split integrals covering separate integration regions.

* * * * *